United States Patent
Park et al.

(10) Patent No.: US 9,112,179 B2
(45) Date of Patent: Aug. 18, 2015

(54) ORGANIC LIGHT EMITTING DIODE DISPLAY

(75) Inventors: Soon-Ryong Park, Yongin (KR); Hee-Seong Jeong, Yongin (KR); Woo-Suk Jung, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 902 days.

(21) Appl. No.: 12/786,304

(22) Filed: May 24, 2010

(65) Prior Publication Data

US 2011/0024780 A1    Feb. 3, 2011

(30) Foreign Application Priority Data

Jul. 28, 2009   (KR) .................. 10-2009-0069059

(51) Int. Cl.
  *H01L 51/52* (2006.01)
  *G02B 5/22* (2006.01)

(52) U.S. Cl.
  CPC ............ *H01L 51/5237* (2013.01); *G02B 5/223* (2013.01); *H01L 51/5253* (2013.01); *H01L 51/5281* (2013.01)

(58) Field of Classification Search
  None
  See application file for complete search history.

(56) References Cited

U.S. PATENT DOCUMENTS

| | | | |
|---|---|---|---|
| 4,802,873 A * | 2/1989 | Barrow et al. | 445/6 |
| 7,456,570 B2 | 11/2008 | Kawamura et al. | |
| 7,659,012 B2 | 2/2010 | Kim et al. | |
| 7,923,923 B2 | 4/2011 | Cho et al. | |
| 8,237,356 B2 | 8/2012 | Cho et al. | |
| 2004/0076853 A1 * | 4/2004 | Jarikov | 428/690 |
| 2005/0058826 A1 | 3/2005 | Decker et al. | |
| 2005/0087769 A1 | 4/2005 | Yamazaki et al. | |
| 2005/0275342 A1 | 12/2005 | Yanagawa | |
| 2007/0132378 A1 | 6/2007 | Cok et al. | |
| 2008/0129189 A1 * | 6/2008 | Cok | 313/503 |
| 2009/0072733 A1 * | 3/2009 | Funayama et al. | 313/506 |

FOREIGN PATENT DOCUMENTS

| | | | | |
|---|---|---|---|---|
| JP | 1986-096695 | * | 5/1986 | ............ H05B 33/04 |
| JP | 07-150136 | | 6/1995 | |
| JP | 07-272848 | | 10/1995 | |
| JP | 09-115664 | | 5/1997 | |
| JP | 2947106 B2 | | 7/1999 | |
| JP | 2003-151775 | | 5/2003 | |

(Continued)

OTHER PUBLICATIONS

Partial English translation of JP 1986-096695. Feb. 11, 2005.*

(Continued)

*Primary Examiner* — J. L. Yang
(74) *Attorney, Agent, or Firm* — Christie, Parker & Hale, LLP (57) ABSTRACT

An organic light emitting diode includes a display substrate assembly including an organic light emitting element; an encapsulation substrate assembly disposed on the display substrate assembly with a space therebetween and sealed with the display substrate assembly in a vacuum-tight manner; and a filling agent filling the space between the display substrate assembly and the encapsulation substrate assembly. The filling agent is adapted to selectively absorb external light entering through the encapsulation substrate assembly and incident on the organic light emitting element as a function of wavelength in a wavelength band of the external light to control transmittance.

15 Claims, 4 Drawing Sheets

(56) References Cited

FOREIGN PATENT DOCUMENTS

| | | | | |
|---|---|---|---|---|
| JP | 2003-257622 | | 9/2003 | |
| JP | 2004-241134 | | 8/2004 | |
| JP | 2006-127815 | | 5/2006 | |
| JP | 2006-172818 | | 6/2006 | |
| JP | 2006-228519 | | 8/2006 | |
| JP | 2006-252857 | | 9/2006 | |
| JP | 2007-042367 | | 2/2007 | |
| JP | 2008-016379 | | 1/2008 | |
| JP | 2008-021480 | | 1/2008 | |
| JP | 2008-59836 | A | 3/2008 | |
| JP | 2008-210788 | | 9/2008 | |
| JP | 2008-235089 | | 10/2008 | |
| KR | 10-0384291 | B1 | 5/2003 | |
| KR | 10-0459175 | B1 | 12/2004 | |
| KR | 10-0553758 | B1 | 2/2006 | |
| KR | 10-2006-0031590 | | 4/2006 | |
| KR | 10-0637179 | B1 | 10/2006 | |
| KR | 10-2007-0071261 | | 7/2007 | |
| KR | 10-0759665 | B1 | 9/2007 | |
| KR | 10-0829753 | B1 | 5/2008 | |
| KR | 10-2008-0087257 | | 10/2008 | |
| KR | 10-2008-0090657 | | 10/2008 | |
| WO | WO 03/101155 | A1 | 12/2003 | |
| WO | WO 2004/095597 | A2 * | 11/2004 | ............ H01L 51/00 |

OTHER PUBLICATIONS

Machine English translation of JP 2008-059836 A. May 31, 2013.*
Patent Abstracts of Japan for Publication 08-162275 dated Jun. 21, 1996, corresponding to Japanese Patent 2947106 dated Jul. 2, 1999 listed above, (1 page).
Korean Patent Abstracts for Korean Publication 10-2002-0069319 dated Aug. 30, 2002, corresponding to Korean Patent 10-0384291 dated May 16, 2003, listed above, (1 page).
Korean Patent Abstracts for Korean Publication 10-2003-0052049 dated Jun. 26, 2003, corresponding to Korean Patent 10-459175 dated Dec. 3, 2004, listed above, (1 page).
Korean Patent Abstracts for Korean Publication 10-2005-0078763 dated Aug. 8, 2005, corresponding to Korean Patent 10-0553758 dated Feb. 20, 2006, listed above, (1 page).
Korean Patent Abstracts for Korean Publication 10-2006-0034927 dated Apr. 26, 2006, corresponding to Korean Patent 10-0637179 dated Oct. 23, 2006, listed above, (1 page).
Korean Patent Abstracts for Korean Publication 10-2007-0078502 dated Aug. 1, 2007, corresponding to Korean Patent 10-0759665 dated Sep. 17, 2007, listed above, (1 page).
EPO Search Report dated Jan. 27, 2014, for corresponding European Patent application 10251340.5, (8 pages).
*Electro-lite is UV Light Curing Technology*, Jan. 1, 2005, pp. 1-2, XP 055097135, URL:http://www.allsealsinc.com/pdf/Electro-lite Compounds.pdf.

* cited by examiner

ORGANIC LIGHT EMITTING DIODE DISPLAY

CROSS-REFERENCE TO RELATED APPLICATION

This application claims priority to and the benefit of Korean Patent Application No. 10-2009-0069059, filed in the Korean Intellectual Property Office, on Jul. 28, 2009, the entire content of which is incorporated herein by reference.

BACKGROUND

1. Field

The following description relates generally to an organic light emitting diode (OLED) display. More particularly, the following description relates generally to an OLED display of which impact durability and display characteristics are improved.

2. Description of the Related Art

An organic light emitting diode (OLED) display is an emissive or self-luminance display, and differs from a liquid crystal display (LCD) in that it does not require a separate light source so that it can be made to be relatively thin and light in weight. Furthermore, as the OLED display has characteristics such as relatively low power consumption, high luminance, and short response time, it has been spotlighted as a next generation display device.

In the OLED display, the hole injection electrodes or the electron injection electrodes of the OLED display, and other various metal wires thereof, reflect light that is incident thereupon from the outside. When the OLED display is used in a bright location, the black color expression and the contrast thereof may be poor due to the reflection of external light.

In order to reduce the reflection of external light, a polarizing plate and a phase delay plate may be utilized in an OLED display for suppressing reflection of the external light. However, a conventional method that suppresses reflection of external light through the polarizing plate and the phase delay plate has a problem in that a large amount of light generated from an organic emission layer can also be lost when the light is emitted to the outside through the polarizing plate and the phase delay plate.

The above information disclosed in this Background section is only for enhancement of understanding of the background of the described technology and therefore it may contain information that does not form the prior art that is already known in this country to a person of ordinary skill in the art.

SUMMARY

An aspect of an embodiment of the present invention is directed toward an OLED display having improved impact durability and ability to suppress reflection of external light to thereby improve visibility and reduce (minimize) a loss of light emitted to the outside from an organic light emitting element in the OLED display.

An organic light emitting diode (OLED) display according to an exemplary embodiment includes: a display substrate assembly including an organic light emitting element; an encapsulation substrate assembly on the display substrate assembly with a space therebetween, the encapsulation substrate assembly being sealed with the display substrate assembly; and a filling agent filling the space between the display substrate assembly and the encapsulation substrate assembly. Here, the filling agent is adapted to selectively absorb external light entering through the encapsulation substrate assembly and incident on the organic light emitting element as a function of wavelength in a wavelength band of the external light to control transmittance.

The filling agent may be adapted to selectively absorb the external light having wavelengths in a wavelength band of 430 nm to 670 nm.

The transmittance of the external light with respect to the filling agent may be higher in a wavelength band of 520 nm to 560 nm than in wavelength bands of 480 nm to 510 nm and of 580 nm to 610 nm.

The transmittance of the external light with respect to the filling agent in a wavelength band of 460 nm to 620 nm may satisfy a W shape like a quartic function having two minimums and one maximum.

The two minimums may be respectively in the wavelength band of 480 nm to 510 nm and the wavelength band of 580 nm to 610 nm, and the maximum may be in the wavelength band of 520 nm to 560 nm.

Wavelengths of more than 80% of emissive light of the organic light emitting element may be in one or more specific wavelength bands, and the one or more specific wavelength bands may not be overlapped with the wavelength bands of 480 nm to 510 nm and of 580 nm to 610 nm.

The wavelengths of more than 80% of the emissive light of the organic light emitting element may be in the wavelength bands of 450 nm to 480 nm, of 510 nm to 560 nm, and of 600 nm to 650 nm.

The filling agent may include a resin containing a light absorbing material.

The transmittance of the external light by the filling agent may be controlled according to the type and content of the light absorbing material.

The resin may include at least one of polycarbonate, polyether sulfone (PES), polymethyl methacrylate, (PMMA), polyethylene terephthalate, or triacetate cellulose.

The light absorbing material may include at least one of carbon black, a polyene-based pigment, an azo-based pigment, an azomethine-based pigment, a diimmonium-based pigment, a phthalocyanine-based pigment, a quinine-based pigment, an indigo-based pigment, a thioindigo-based pigment, a dioxadin-based pigment, a quinacridone-based pigment, an isoindolinone-based pigment, a metal oxide, a metal complex, or aromatic hydrocarbons.

The polyene-based pigment may include a compound represented by at least one of Formula 1 or Formula 2:

Formula 1

The azo-based pigment may include a compound represented by Formula 3:

Formula 3

The quinacridone-based pigment may include a compound represented by at least one of Formula 4 or Formula 5:

Formula 4

Formula 5

The quinine-based pigment may include a compound represented by at least one of Formula 6, Formula 7, or Formula 8:

Formula 6

Formula 7

Formula 8

The indigo-based pigment may include a compound represented by at least one of Formula 9, Formula 10, or Formula 11:

Formula 9

Formula 10

Formula 11

The aromatic hydrocarbons may include a compound represented by at least one of Formula 12, Formula 13, Formula 14, Formula 15, Formula 16, Formula 17, or Formula 18:

Formula 12

Formula 13

Formula 14

Formula 15

Formula 16

Formula 17

Formula 18

According to the present invention, the OLED display improves impact durability and at the same time improves visibility by suppressing reflection of external light, and a loss of light emitted to the outside from the organic light emitting element can be reduced (minimized).

DETAILED DESCRIPTION

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. Like reference numerals designate like elements throughout the specification.

Figure 2:
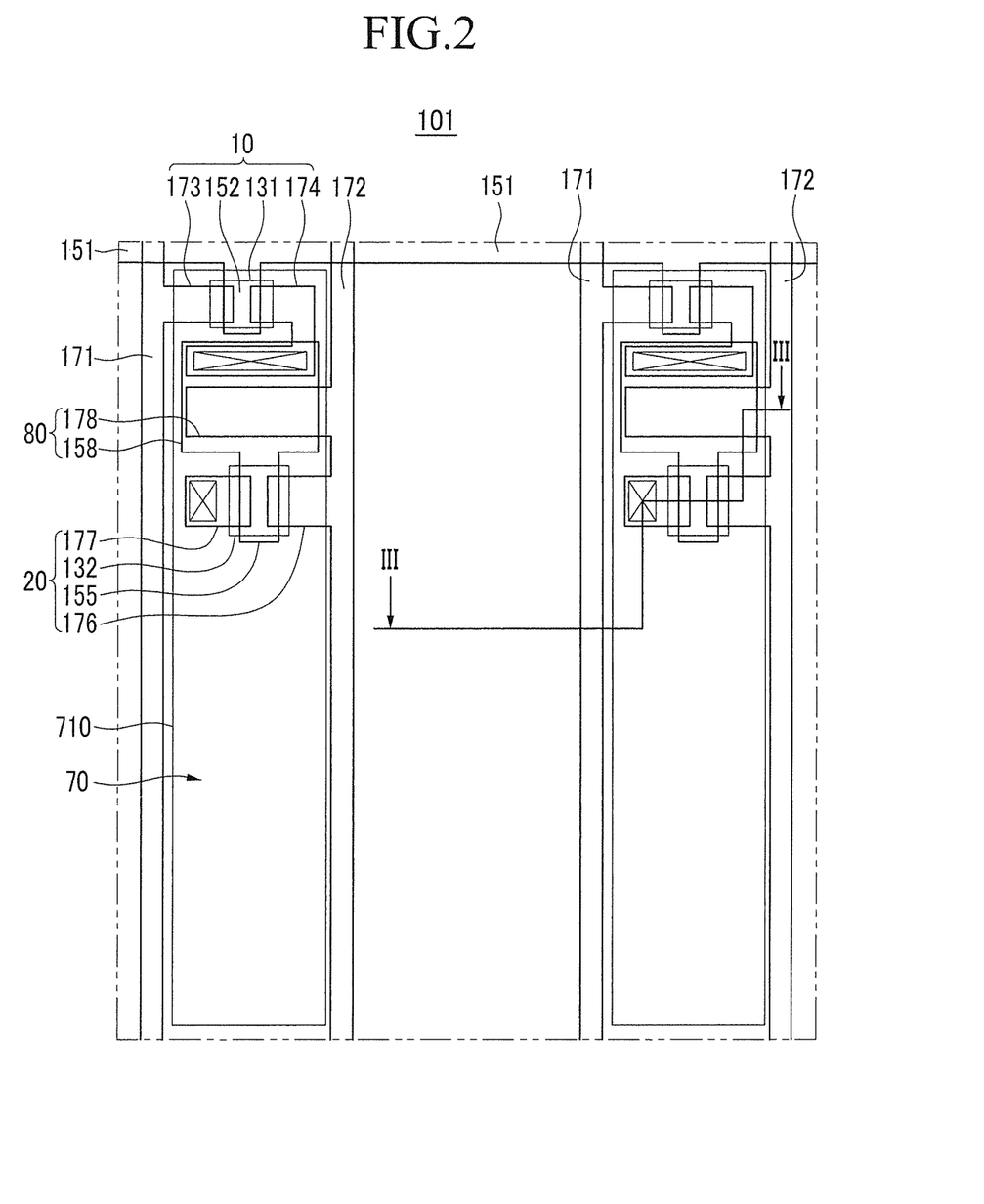
FIG. 2 is an enlarged layout view of an internal structure of the OLED display of FIG. 1.
Figure 3:
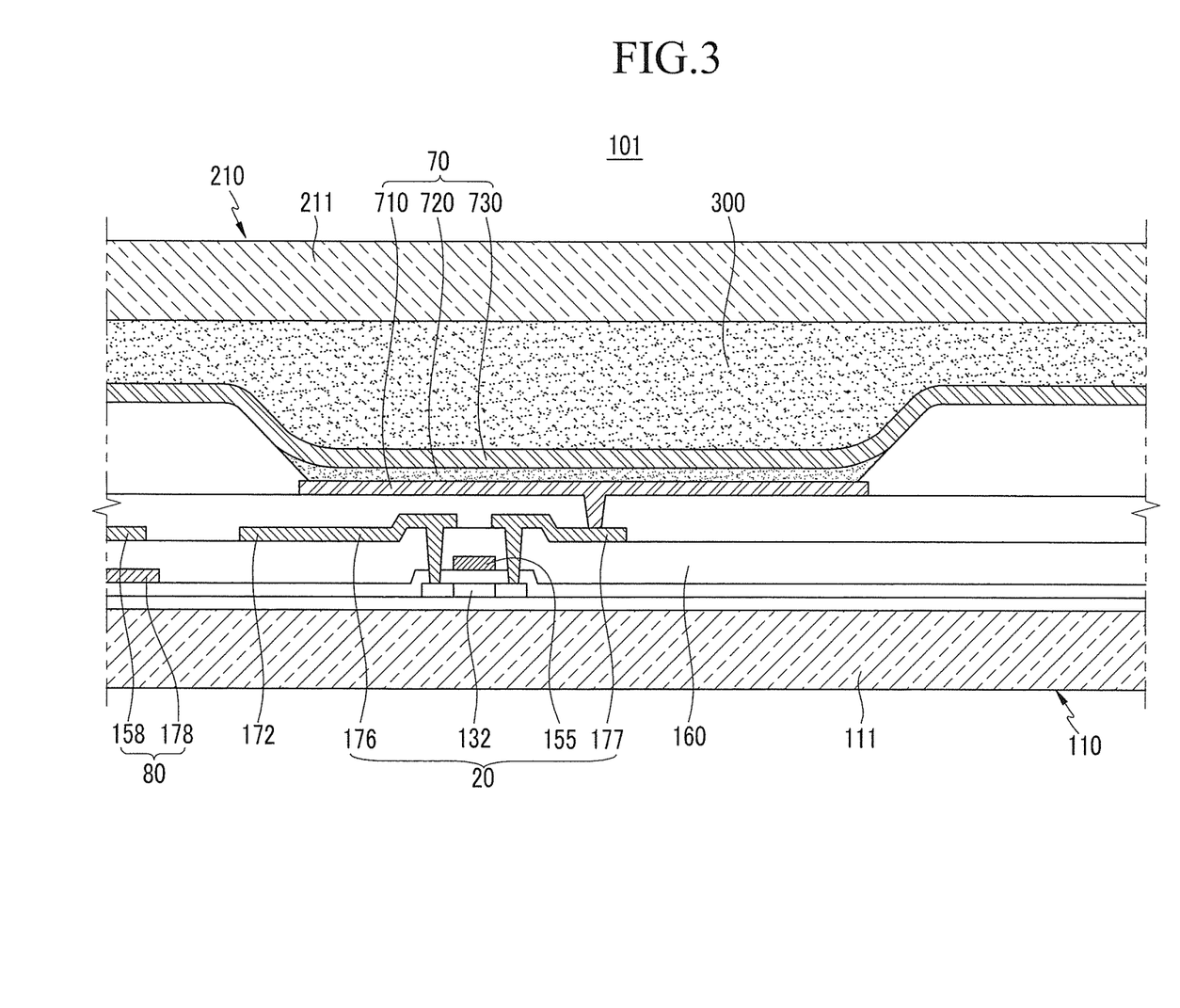
FIG. 3 is a cross-sectional view of FIG. 2, taken along the line III-III.

In addition, in FIG. 2 and FIG. 3, an organic light emitting diode (OLED) display is illustrated as an active matrix (AM)-type OLED display in a 2Tr-1Cap structure in which two TFTs T1 and T2 and one storage capacitor C1 are formed in one pixel, but the present invention is not limited thereto. Therefore, the OLED display according the embodiments of the present invention can have various suitable structures. For example, three or more TFTs and two or more capacitors can be provided in one pixel of the OLED display, and separate wires can be further provided in the OLED display. Here, a pixel is a minimum unit for displaying an image, and the OLED display displays an image by using a plurality of pixels.

Hereinafter, an exemplary embodiment will be described with reference to FIGS. 1, 2, and 3.

Figure 1:
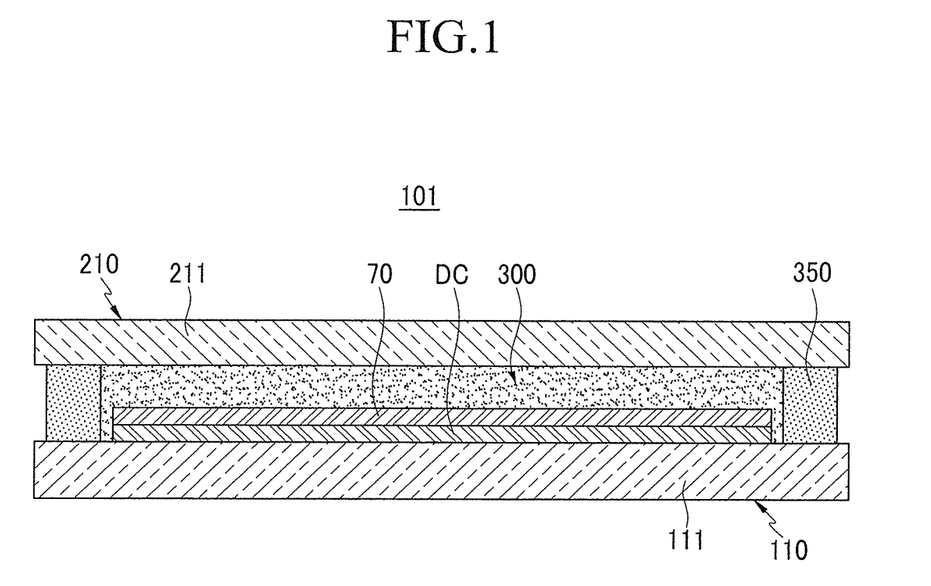
FIG. 1 is a cross-sectional view of an organic light emitting diode (OLED) display according to an exemplary embodiment.

As shown in FIG. 1, an organic light emitting diode (OLED) display 101 according to an exemplary embodiment includes a display substrate assembly 110, an encapsulation substrate assembly 210, a sealant 350, and a filling agent 300.

The display substrate assembly 110 includes a first substrate 111, a driving circuit (DC), and an organic light emitting element 70. The driving circuit DC and the organic light emitting element 70 are formed on the first substrate 111.

The first substrate 111 may be formed of an insulating substrate made of glass, quartz, ceramic, and/or plastic. However, the exemplary embodiment is not limited thereto, and the first substrate 111 may be formed of a metallic substrate made of stainless steel.

The driving circuit DC includes thin film transistors 10 and 20 (shown in FIG. 5), and drives the organic light emitting element 70. The organic light emitting element 70 emits light according to a driving signal transmitted from the driving circuit DC to display images.

Detailed structures of the organic light emitting element 70 and the driving circuit DC are shown in FIG. 2 and FIG. 3, but the exemplary embodiment is not limited to the structures shown in FIG. 2 and FIG. 3. The OLED 70 and the driving circuit may be suitably modified.

Also, in the exemplary embodiment, wavelengths of more than 80% of light emitted from the organic light emitting element 70 are in wavelength ranges (bands) of 450 nm to 480 nm, of 510 nm to 560 nm, and of 600 nm to 650 nm. That is, the organic light emitting element 70 mainly emits white light which is a mixture of light having wavelengths in the three wavelength ranges (bands).

The encapsulation substrate assembly 210 is disposed at a distance from the display plate 110, and the encapsulation substrate assembly 210 and the display substrate assembly 110 are sealed in a vacuum-tight manner. As described, the encapsulation substrate assembly 210 sealed with the display substrate assembly 110 covers the organic light emitting element 70 and the driving circuit DC of the display substrate assembly 110 for protection. The encapsulation substrate assembly 210 includes a second substrate 211 made of a transparent material such as glass and plastic.

The filling agent 300 is disposed between the display substrate assembly 110 and the encapsulation substrate assembly 210 to fill a space formed between the display substrate assembly 110 and the encapsulation substrate assembly 210. As described, the filling agent 300 improves mechanical strength by filling the space between the display substrate assembly 110 and the encapsulation substrate assembly 210. That is, the inside of the OLED display 101 is filled with the filling agent 300 so that durability to external impact can be improved.

In addition, the filling agent 300 selectively absorbs external light incident upon the organic light emitting element 70 of the display substrate assembly 110 that has entered from the outside through the encapsulation substrate assembly 210 depending on (or as a function) the wavelength in the wavelength range (band) of the external light to control transmittance.

In the exemplary embodiment, the filling agent 300 absorbs external light in a wavelength range of 430 nm to 670 nm. In addition, the filling agent 300 absorbs a different amount of external light depending on (or as a function of) the wavelength in the wavelength range of 430 nm to 670 nm. That is, the filling agent 300 selectively absorbs the external light so that transmittance of the external light with respect to the filling agent 300 is changed depending of the wavelength of the wavelength range (band).

In further detail, a wavelength band-specific transmittance of the external light with respect to the filling agent 300 is higher in the wavelength range of 520 nm to 560 nm than in the wavelength range of 480 nm to 510 nm and the wavelength range of 580 nm to 680 nm.

That is, a graph illustrating the wavelength band-specific transmittance of the external light with respect to the filling agent 300 has a W-shape like a quartic function having two minimums and one maximum within a wavelength range of 460 nm to 620 nm. Here, the two minimums are respectively located in a wavelength range of 480 nm to 510 nm and a wavelength range of 580 nm to 610 nm, and the maximum is located in a wavelength range of 520 nm to 560 nm. As described, the filling agent 300 absorbs external light in a specific wavelength range (band) among external light that has entered through the encapsulation substrate assembly 210 and is incident upon the organic light emitting element 70 of the display substrate assembly 110 so as to suppress reflection of external light. The filling agent 300 absorbs some external light included in the wavelength range of 430 nm to 670 nm, and intensively absorbs external light included in the wavelength range of 580 nm to 680 nm.

Emissive light of the organic light emitting element 70 is mainly included in wavelength ranges of 450 nm to 480 nm, 510 nm to 560 nm, and 600 nm to 650 nm. Here, as described above, the wavelengths of more than 80% of the emissive light of the organic light emitting element 70 are included in one or more specific wavelength bands (e.g., the above three described specific wavelength ranges (bands)), and the one or more specific wavelength bands (to which the wavelengths of most of the emissive light are included in) are not overlapped with the wavelength bands where the transmittance of the external light with respect to the filling agent 300 is relatively low, which are in the wavelength ranges (bands) of 480 nm to 510 nm and of 580 nm to 610 nm. Therefore, compared to the external light, a loss of the emissive light of the organic light emitting element 70 when passing through the filling agent 300 is relatively low.

As described, the transmittance of the filling agent 300 is controlled to reduce or minimize absorption of emissive light of the organic light emitting element 70 and increase or maximize absorption of external light. That is, the filling agent 300 suppresses reflection of external light by absorbing a great amount of external light, but a relatively small amount of emissive light of the organic light emitting element 70, passing through the filling agent 300, is lost. Accordingly, the filling agent 300 can reduce or minimize a loss of light emitted outside from the organic light emitting element 70 while improving visibility by suppressing reflection of external light.

In addition, the filling agent 300 includes a resin containing a light absorbing material. The external light transmittance by the filling agent 300 can be controlled according to the type and content of the light absorbing materials that are utilized.

Here, in one embodiment, the resin includes polycarbonate, polyether sulfone (PES), polymethyl methacrylate, (PMMA), polyethylene terephthalate, and/or triacetate cellulose.

The light absorbing material includes carbon black, a polyene-based pigment, an azo-based pigment, an azomethine-based pigment, a diimmonium-based pigment, a phthalocyanine-based pigment, a quinine-based pigment, an indigo-based pigment, a thioindigo-based pigment, a dioxadin-based pigment, a quinacridone-based pigment, an isoindolinone-based pigment, a metal oxide, a metal complex, and/or aromatic hydrocarbons.

The light absorbing material absorbs light in a specific wavelength band according to the type thereof. Therefore, the filling agent 300 may have transmittance that is selective to a wavelength band of external light according to the light absorbing material included therein. That is, light transmittance can be intensively controlled in a specific wavelength band in consideration of external light of which reflection is to be suppressed and a main wavelength band of the emissive light of the organic light emitting element 70. In this case, the light absorbing material can be made of a combination of various suitable materials.

Some of light absorbing materials that can be included in the filling agent 300 will be exemplarily described in further detail. The filling agent 300 can selectively control a transmittance of external light in a specific wavelength band by including one or two or more of light absorbing materials to be described hereinafter.

In one embodiment, the polyene-based pigment includes a compound represented by Formula 1 and/or Formula 2.

Formula 1

Formula 2

Here, the compound of Formula 1 is called dodecapreno-beta-carotene, and enables absorbing of light having a wavelength range of about 480 nm to about 530 nm. The compound of Formula 2 is called a trans-stilbene, and enables absorbing of light having a wavelength of about 525 nm.

In one embodiment, the azo-based pigment includes a compound represented by Formula 3.

Formula 3

Here, the compound of Formula 3 enables absorbing of light having a wavelength of about 518 nm.

In one embodiment, the quinacridone-based pigment includes a compound represented by Formula 4 and/or Formula 5.

Formula 4

Formula 5

Here, the compound of Formula 4 may absorb light having a wavelength of about 523 nm, and the compound of Formula 5 may absorb light having a wavelength of about 528 nm.

In one embodiment, the quinine-based pigment includes a compound represented by Formula 6, Formula 7, and/or Formula 8.

Formula 6

Formula 7

Formula 8

Here, the compound of Formula 6 may absorb light having a wavelength of about 528 nm, the compound of Formula 7 may absorb light having a wavelength of about 549 nm, and the compound of Formula 8 may absorb light having a wavelength of about 508 nm.

In one embodiment, the indigo-based pigment includes a compound represented by Formula 9, Formula 10, and/or Formula 11.

Formula 9

Formula 10

Formula 11

Here, the compound of Formula 9 may absorb light having a wavelength of about 546 nm, the compound of Formula 10 may absorb light having a wavelength of about 505 nm, and the compound of Formula 11 may absorb light having a wavelength of about 534 nm.

In one embodiment, the aromatic hydrocarbons include a compound represented by Formula 12, Formula 13, Formula 14, Formula 15, Formula 16, Formula 17, and/or Formula 18.

Formula 12

Formula 13

Formula 14

Formula 15

Formula 16

Formula 17

Formula 18

Here, the compound of Formula 12 may absorb light having a wavelength of about 523 nm, and the compound of Formula 13 may absorb light having a wavelength of about 512 nm. The compound of Formula 14 may absorb light having a wavelength of about 510 nm, and the compound of Formula 15 may absorb light having a wavelength of about 519 nm. The compound of Formula 16 may absorb light having a wavelength of about 534 nm, the compound of Formula 17 may absorb light having a wavelength of about 523 nm, and the compound of Formula 18 may absorb light having a wavelength of about 521 nm.

The sealant 350 is disposed between edges or edge portions of the display substrate assembly 110 and the encapsulation substrate assembly 210 to seal them in a vacuum-tight manner. That is, the display substrate assembly 110 and the encapsulation substrate assembly 210 are sealed in a vacuum-tight manner by the sealant 350.

With the above-described configuration, the OLED display 101 can improve impact durability and at the same time improves visibility by suppressing reflection of external light, and loss of light emitted to the outside from the organic light emitting element 70 can be reduced or minimized. Therefore, use efficiency of overall light in the OLED display 101 is increased so that luminance can be improved.

In addition, the OLED display 101 can reduce power consumption and have an increased life-span.

Hereinafter, an internal structure of the OLED display 101 will be described in further detail with reference to FIG. 2 and FIG. 3. FIG. 2 is a layout view of a pixel structure, focusing on the display substrate assembly 110, and FIG. 3 is a cross-sectional view of the display substrate assembly 110 and the encapsulation substrate assembly 210 of FIG. 2, taken along the line III-III.

As shown in FIG. 2 and FIG. 3, the display substrate assembly 110 includes a switching thin film transistor 10, a driving thin film transistor 20, a capacitor 80, and an OLED 70, which are formed at each pixel. Here, a configuration including the switching thin film transistor 10, the driving thin film transistor 20, and the capacitor 80 is referred to as a driving circuit DC. In addition, the display substrate assembly 110 further includes gate lines 151 arranged to extend in a first direction, and data lines 171 and common power lines 172 that extend in a second direction crossing the first direction of the gate lines 151 in an insulated manner. Here, a pixel is defined by taking a gate line 151, a data line 171, and a common power line 172 as boundaries of the pixel, but the present invention is not limited thereto.

The organic light emitting element 70 includes a pixel electrode 710, an organic emission layer 720 formed on the pixel electrode 710, and a common electrode 730 formed on the organic emission layer 730. The pixel electrode 710 functions as a positive (+) electrode that is utilized as a hole injection electrode, and the common electrode 730 functions as a negative (−) electrode that is utilized as an electron injection electrode. However, the present invention is not limited thereto, and depending upon the way of driving the OLED display 100, it is possible that the pixel electrode 710 functions as the negative electrode and the common electrode 730 functions as the positive electrode. Holes and electrons from the pixel electrode 710 and the common electrode 730 are injected into the organic emission layer 720. When excitons generated from combinations of electrons and holes shift from an excited state to a ground state, light emission occurs.

In the OLED display 101 according to an exemplary embodiment, the organic light emitting element 70 emits light toward a direction of the encapsulation substrate assembly 210. That is, the organic light emitting element 70 is formed as a front emission type. For light emission of the organic light emitting element 70 toward the encapsulation substrate assembly 210 direction, the pixel electrode 710 may be formed as a reflective electrode and the common electrode 730 may be formed as a transparent or semi-transparent electrode.

The capacitor 80 includes a pair of capacitive plates 158 and 178, interposing an interlayer insulating layer 160 therebetween. Here, the interlayer insulating layer 160 functions as a dielectric material. Capacitance is determined according to charges charged at the capacitor 80 and a voltage between the capacitive plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switch for selecting a pixel to emit light. The switching gate electrode 152 is connected to a gate line 151. The switching source electrode 173 is connected to a data line 171. The switching drain electrode 174 is disposed at a distance from the switching source electrode 173 and is connected to one of the capacitive plates, for example, the capacitive plate 158.

The driving thin film transistor 20 applies a driving voltage to a pixel electrode 710 to excite an organic emission layer 720 of an organic light emitting element 70 in the selected pixel. The driving gate electrode 155 is connected to the capacitive plate 158 connected to the switching drain electrode 174. The driving source electrode 176 and the other capacitive plate 178 are respectively connected to a common power line 172. The driving drain electrode 177 is connected to the pixel electrode 710 of the organic light emitting element 70 through a contact hole.

With the above structure, the switching thin film transistor 10 is operated by the gate voltage applied to the gate line 161, and transmits the data voltage applied to the data line 171 to the driving thin film transistor 20. The voltage with a value corresponding to a difference between the common voltage applied to the driving thin film transistor 20 from the common power line 172 and the data voltage transmitted from the switching thin film transistor 10 is stored at the capacitor 80, and the current corresponding to the voltage stored at the capacitor 80 flows to the organic light emitting element 70 through the driving thin film transistor 20 to thereby excite the OLED 70 to emit light.

As shown in FIG. 3, the encapsulation substrate assembly 210 is disposed on the organic light emitting element 70 for protecting the encapsulation substrate assembly 210. In addition, the filling agent 300 is filled between the display substrate assembly 110 and the encapsulation substrate assembly 210.

Hereinafter, referring to FIG. 4, an effect of embodiments of the present invention will be described in further detail through Experimental Example 1 and Experimental Example 2. Experimental Example 1 and Experimental Example 2 were performed with different types and contents of a light absorbing material included in the filling agent 300.

Figure 4:
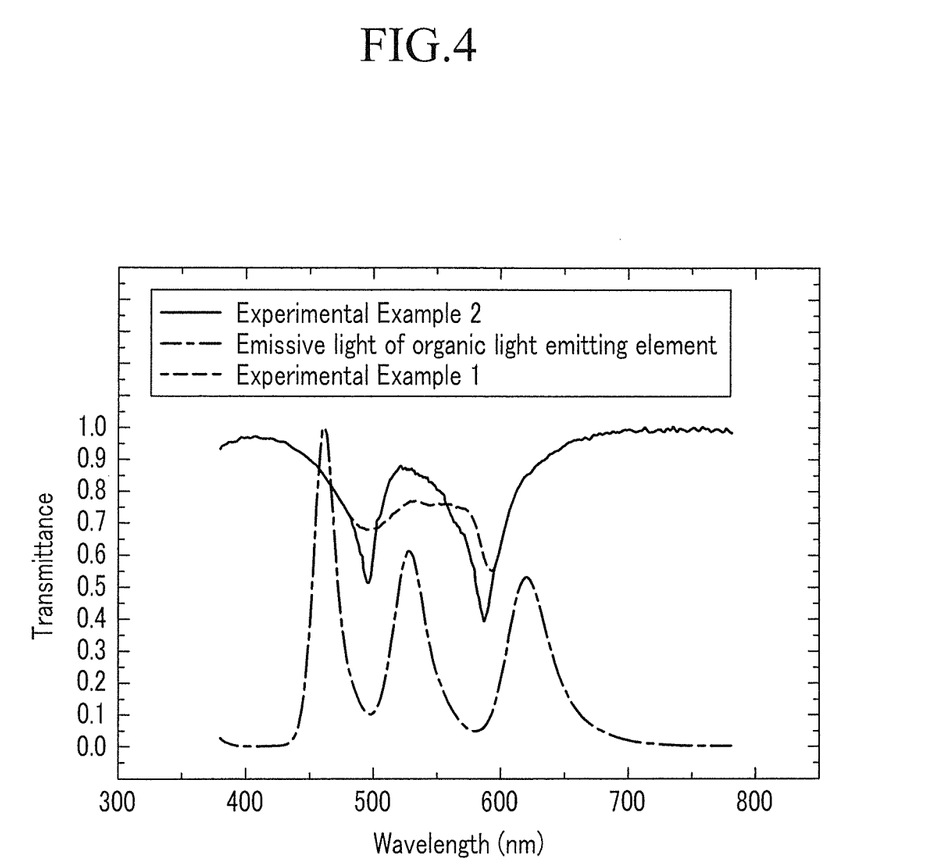
FIG. 4 is a graph illustrating a transmittance distribution for each wavelength band of Experimental Example 1 and Experimental Example 2 according to embodiments of the present invention.

As shown in FIG. 4, the Experimental Example 1 and Experimental Example 2 both have W-type graphs for wavelength band-specific transmittance of external light through the filling agent. In addition, the band-specific transmittance of external light through the filling agent is higher in a range other than the ranges of 480 nm to 510 nm and 580 nm to 680 nm.

In addition, as shown in FIG. 4, a wavelength of an emissive light of the OLED according to the exemplary embodiment is mainly included within the wavelength ranges of 450 nm to 480 nm, 510 nm to 560 nm, and 600 nm to 650 nm.

Therefore, according to the Experimental Example 1 and Experimental Example 2, the filling agent absorbs most of the external light but a loss of the emissive light of the OLED passing through the filling agent is relatively small. That is, both of the Experimental Example 1 and Experimental Example 2 suppress reflection of external light while reducing or minimizing a loss of light emitted to the outside from the OLED.

However, compared to the Experimental Example 1 and Experimental Example 2, a typical filling agent that does not have a selective light absorbing function has a transmittance range of 0.9 to 1, and has a straight line-type graph for wavelength band-specific transmittance of external light through the typical filling agent. Therefore, the conventional typical filling agent cannot suppress reflection of external light.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode (OLED) display comprising:
   a display substrate assembly comprising an organic light emitting element;
   an encapsulation substrate assembly on the display substrate assembly with a space therebetween, the encapsulation substrate assembly being sealed with the display substrate assembly; and
   a filling agent filling the space between the display substrate assembly and the encapsulation substrate assembly, wherein the filling agent is adapted to selectively absorb external light entering through the encapsulation substrate assembly and incident on the organic light emitting element as a function of wavelength in a wavelength band of the external light to control transmittance;

wherein the filling agent is adapted to selectively absorb the external light having wavelengths in a wavelength band of 430 nm to 670 nm;

wherein the transmittance of the external light with respect to the filling agent is higher in a wavelength band of 520 nm to 560 nm than in wavelength bands of 480 nm to 510 nm and of 580 nm to 610 nm; and wherein the filling agent includes a compound represented by at least one of Formula 13, Formula 15, Formula 16, Formula 17, or Formula 18:

Formula 13

Formula 15

Formula 16

Formula 17

Formula 18

2. The OLED display of claim 1, wherein the transmittance of the external light with respect to the filling agent in a wavelength band of 460 nm to 620 nm satisfies a W shape like a quartic function having two minimums and one maximum.

3. The OLED display of claim 2, wherein the two minimums are respectively in the wavelength band of 480 nm to 510 nm and the wavelength band of 580 nm to 610 nm, and the maximum is in the wavelength band of 520 nm to 560 nm.

4. The OLED display of claim 1, wherein wavelengths of more than 80% of emissive light of the organic light emitting element are in one or more specific wavelength bands, and the one or more specific wavelength bands are not overlapped with the wavelength bands of 480 nm to 510 nm and of 580 nm to 610 nm.

5. The OLED display of claim 4, wherein the wavelengths of more than 80% of the emissive light of the organic light emitting element are in the wavelength bands of 450 nm to 480 nm, of 510 nm to 560 nm, and of 610 nm to 650 nm.

6. The OLED display of claim 1, wherein the filling agent comprises a resin containing a light absorbing material.

7. The OLED display of claim 6, wherein the resin comprises at least one of polycarbonate, polyether sulfone (PES), polymethyl methacrylate, (PMMA), polyethylene terephthalate, or triacetate cellulose.

8. The OLED display of claim 6, wherein the light absorbing material comprises at least one of carbon black, a polyene-based pigment, an azo-based pigment, an azomethine-based pigment, a diimmonium-based pigment, a phthalocyanine-based pigment, a quinine-based pigment, an indigo-based pigment, a thioindigo-based pigment, a dioxadin-based pigment, a quinacridone-based pigment, an isoindolinone-based pigment, a metal oxide, or a metal complex.

9. The OLED display of claim 8, wherein the polyene-based pigment comprises a compound represented by at least one of Formula 1 or Formula 2:

Formula 1

Formula 2

10. The OLED display of claim 8, wherein the azo-based pigment comprises a compound represented by Formula 3:

Formula 3

11. The OLED display of claim 8, wherein the quinacridone-based pigment comprises a compound represented by at least one of Formula 4 or Formula 5:

Formula 4

Formula 5

12. The OLED display of claim 8, wherein the quinine-based pigment comprises a compound represented by at least one of Formula 6, Formula 7, or Formula 8:

Formula 6

Formula 7

Formula 8

13. The OLED display of claim 8, wherein the indigo-based pigment comprises a compound represented by at least one of Formula 9, Formula 10, or Formula 11:

Formula 9

Formula 10

Formula 11

14. An organic light emitting diode (OLED) display comprising:
a display substrate assembly comprising an organic light emitting element;
an encapsulation substrate assembly on the display substrate assembly with a space therebetween, the encapsulation substrate assembly being sealed with the display substrate assembly; and a filling agent filling the space between the display substrate assembly and the encapsulation substrate assembly, the filling agent being adapted to protect the organic light emitting element from impact and to selectively absorb more light in a wavelength band of external light entering through the encapsulation substrate assembly and incident on the organic light emitting element than light in a wavelength band of emissive light emitted by the organic light emitting element;

wherein the filling agent is adapted to selectively absorb the external light having wavelengths in a wavelength band of 430 nm to 670 nm;

wherein the transmittance of the external light with respect to the filling agent is higher in a wavelength band of 520 nm to 560 nm than in wavelength bands of 480 nm to 510 nm and of 580 nm to 610 nm; and wherein the filling agent includes a compound represented by at least one of Formula 13, Formula 15, Formula 16, Formula 17, or Formula 18:

Formula 13

Formula 15

Formula 16

Formula 17

Formula 18

15. The OLED display of claim 14, wherein the transmittance of the external light with respect to the filling agent is higher in the wavelength bands of 450 nm to 480 nm, of 510 nm to 560 nm, and of 600 nm to 650 nm than in wavelength bands of 480 nm to 510 nm and of 580 nm to 610 nm.

* * * * *